United States Patent
Hirler et al.

(10) Patent No.: US 8,796,761 B2
(45) Date of Patent: Aug. 5, 2014

(54) SEMICONDUCTOR DEVICE INCLUDING CHARGED STRUCTURE AND METHODS FOR MANUFACTURING A SEMICONDUCTOR DEVICE

(75) Inventors: Franz Hirler, Isen (DE); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 198 days.

(21) Appl. No.: 13/420,772

(22) Filed: Mar. 15, 2012

(65) Prior Publication Data
US 2013/0240986 A1    Sep. 19, 2013

(51) Int. Cl.
*H01L 29/78* (2006.01)
*H01L 21/336* (2006.01)

(52) U.S. Cl.
USPC ............. 257/330; 257/E29.262; 257/E21.41; 438/270

(58) Field of Classification Search
CPC .......................... H01L 29/408; H01L 29/7813
USPC .................... 257/330–334, E29.262, E21.41; 438/270–272
See application file for complete search history.

(56) References Cited

U.S. PATENT DOCUMENTS

| 4,048,350 | A | 9/1977 | Glang et al. |
| 6,509,233 | B2 | 1/2003 | Chang et al. |
| 2010/0013552 | A1* | 1/2010 | Darwish et al. ............... 327/581 |
| 2011/0133272 | A1 | 6/2011 | Mauder et al. |

FOREIGN PATENT DOCUMENTS

| DE | 10210138 B4 | 7/2005 |
| DE | 102006062011 B4 | 12/2008 |

* cited by examiner

*Primary Examiner* — Daniel Shook
(74) *Attorney, Agent, or Firm* — Murphy, Bilak & Homiller, PLLC (57) ABSTRACT

A semiconductor device includes a trench region extending into a drift zone of a semiconductor body from a surface. The semiconductor device further includes a dielectric structure extending along a lateral side of the trench region, wherein a part of the dielectric structure is a charged insulating structure. The semiconductor device further includes a gate electrode in the trench region and a body region of a conductivity type other than the conductivity type of the drift zone. The charged insulating structure adjoins each one of the drift zone, the body region and the dielectric structure and further adjoins or is arranged below a bottom side of a gate dielectric of the dielectric structure.

19 Claims, 13 Drawing Sheets

SEMICONDUCTOR DEVICE INCLUDING CHARGED STRUCTURE AND METHODS FOR MANUFACTURING A SEMICONDUCTOR DEVICE

BACKGROUND

The development of new generations of semiconductor components, in particular of vertical power semiconductor components, is driven by the goal of increasing a switching speed of switching elements, e.g. Field Effect Transistors (FETs), and reducing the so-called specific on-resistance Ron (resistance per unit area). Reducing Ron allows to minimize the static power loss and to provide power semiconductor components having a higher current density. It is thereby possible to use smaller and hence more cost-effective semiconductor components for the same total current.

It is desirable to provide an improved trade-off between the specific on-resistance Ron of semiconductor components and their switching speed and to provide methods for manufacturing these semiconductor components.

SUMMARY

According to an embodiment of a semiconductor device, the semiconductor includes a trench region extending into a drift zone of a semiconductor body from a surface. The semiconductor device further includes a dielectric structure extending along a sidewall of the trench region, wherein a part of the dielectric structure is a charged insulating structure. The semiconductor device further includes a gate electrode in the trench region and a body region of a conductivity type other than the conductivity type of the drift zone. The charged insulating structure adjoins each one of the drift zone, the body region and the dielectric structure and further adjoins or is arranged below a bottom side of a gate dielectric of the dielectric structure.

According to an embodiment of a method for manufacturing semiconductor device, the method includes forming a trench region extending into a drift zone of a semiconductor body from a surface. The method further includes forming a first part of a dielectric structure in a first part of the trench region and forming a charged insulating structure as a second part of the dielectric structure on a sidewall of the trench region in a second part of the trench region above the first part. The method further includes forming a third part of the dielectric structure in the second part of the trench region. The method further includes forming a fourth part of the dielectric structure above the charged insulating structure, forming a gate electrode in the trench region and forming a body region adjoining the charged insulating structure.

According to another embodiment of a method for manufacturing a semiconductor device, the method includes forming a trench region extending into a drift zone of a semiconductor body from a surface. The method further includes forming, as a first part of a dielectric structure, a charged insulating structure adjoining each one of a sidewall of the trench region and a bottom side of the trench region in a first part of the trench region. The method further includes forming a second part of the dielectric structure in the first part of the trench region and forming a third part of the dielectric structure above the charged insulating structure at the sidewall of the trench region. The method further includes forming a gate electrode in the trench region and forming a body region adjoining the charged insulating structure.

According to yet another embodiment of a method for manufacturing a semiconductor device, the method includes forming a trench region extending into a drift zone of a semiconductor body from a surface. The method further includes forming a charged insulating structure adjoining a sidewall of the trench region. The method further includes forming a gate dielectric adjoining a sidewall of the trench region above the charged insulating structure. The method further includes a gate electrode in the trench region and forming a body region adjoining the charged insulating structure.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. Doping regions of the same relative doping concentration may or may not have the same absolute doping concentration. For example, two different n$^+$-doped regions can have different absolute doping concentrations. The same applies, for example, to an n$^-$-doped and a p$^+$-doped region. In the embodiments described below, a conductivity type of the illustrated semiconductor regions is denoted n-type or p-type, in more detail one of n$^-$ type, n-type, n$^+$-type, p$^-$ type, p-type and p$^+$-type. In each of the illustrated embodiments, the conductivity type of the illustrated semiconductor regions may be vice versa. In other words, in an alternative embodiment to any one of the embodiments described below, an illustrated p-type region may be n-type and an illustrated n-type region may be p-type.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

Figure 1:
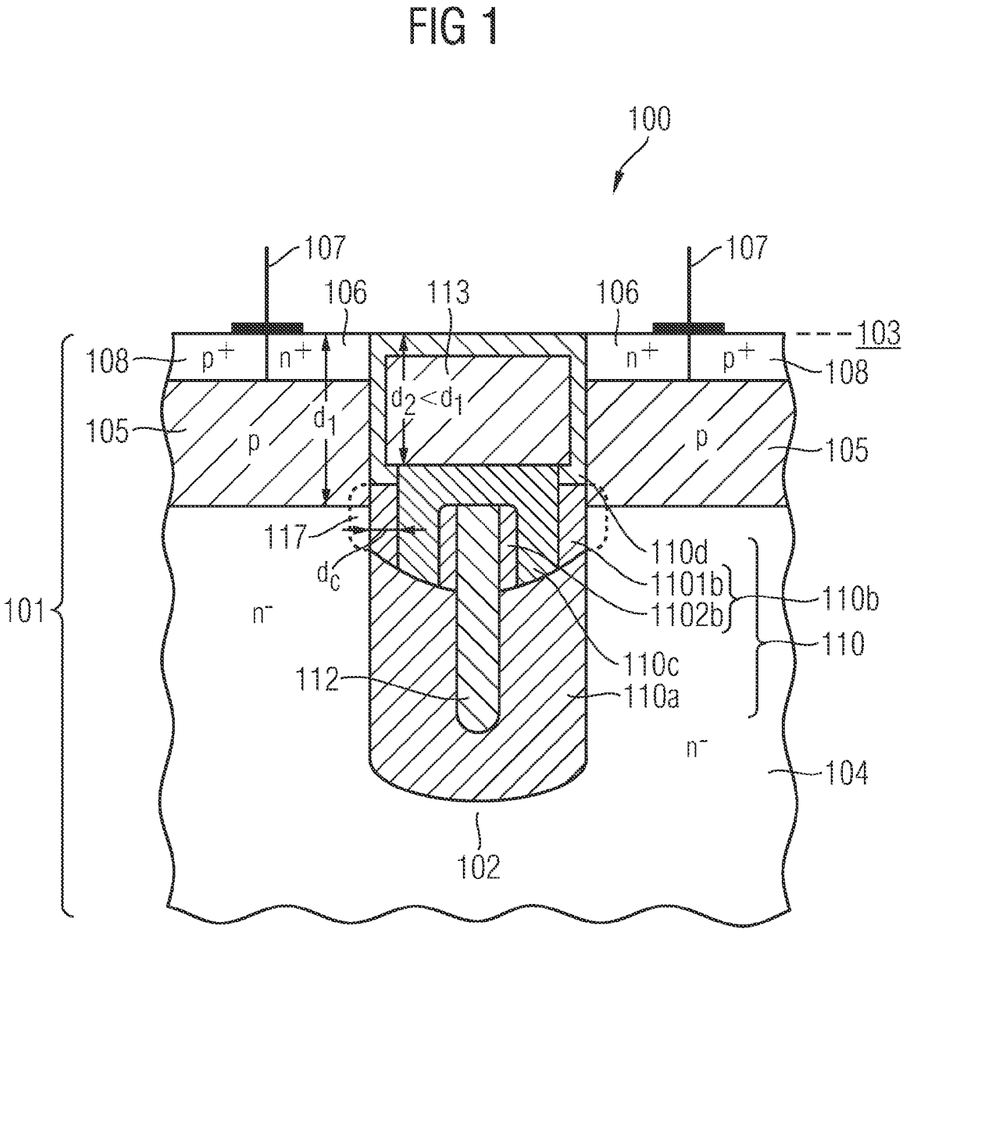
FIGS. 1 to 3 illustrate schematic cross-sections of semiconductor devices including auxiliary structures configured to improve the trade-off between the specific on-state resistance Ron and the gate to drain charge Qgd.

FIG. 1 illustrates a cross-section of a part of a semiconductor device 100 according to an embodiment. The semiconductor device 100 includes a semiconductor body 101. A trench 102 extends into the semiconductor body 101 from a surface 103. An n$^-$-type drift zone 104 adjoins a lower part of the trench 102. A p-type body region 105 adjoins an upper part of the trench 102. An n$^+$-type source region 106 is arranged in the p-type body region 105 and adjoins the trench 102. The n$^+$-type source region 106 is electrically coupled to a contact 107 on the surface 103. The contact 107 is illustrated in a simplified manner and may include a conductive material in contact with the surface 107, e.g. a conductive plug or a conductive line including one or more of doped semiconductor material(s), silicide(s), metal(s). The p-type body region 105 is electrically coupled to the contact 107 via a p$^+$-type body contact zone 108.

In the semiconductor device 100, the source region 106 and the drift zone 104 are doped with a dopant of a first conductivity type in this embodiment, for example arsenic (As) for an n-type doping. However, phosphorus (P), sulphur (S) and/or antimony (Sb) can be used as the n-type dopant. By contrast, the body region 105 and the body contact zone 108 are doped with a dopant of a second conductivity type such as, for example boron (B), aluminum (Al) and/or indium (In) as p-type dopant. Depending on the dopant used for the individual regions, therefore, an n-channel or p-channel field effect transistor may be formed as the semiconductor device 100. In the semiconductor device 100, the n-type drift zone 104 may adjoin an n$^+$-type drain (not illustrated in FIG. 1) at a second surface opposite to the surface 103. The second surface may constitute a rear side of the semiconductor body 101 and the surface 103 may constitute a front side of the semiconductor body 101. According to another embodiment, the n$^+$-type drain (not illustrated in FIG. 1) may be arranged as an up-drain at the surface 103.

In the trench 102 a dielectric structure 110 is arranged. The dielectric structure 110 includes a first dielectric part 110a in a lower part of the trench 102, a charged insulating structure 110b as a second dielectric part in a middle part of the trench 102, a third dielectric part 110c in the middle part of the trench 102, and a fourth dielectric part 110d in an upper part of the trench 102. Each one of the first to fourth dielectric parts 110a . . . 110d includes one or more electrically insulating materials such as oxide and/or nitride, for example.

According to the embodiment illustrated in FIG. 1, the charged insulating structure 110b may include a positive charge per unit area at the sidewall of the trench 102 of at least $10^{12}$ cm$^{-2}$. As an example, the charged insulating structure 110b may include cesium (Cs). As an example, a lateral thickness d$_c$ of the charged insulating structure 110b is in a range between 3 nm to 100 nm. According to another embodiment, the charged insulating structure 110b may include a negative charge per unit area of at least $10^{12}$ cm$^{-2}$ and a conductivity type of the body region is n-type, i.e. a conductivity type of a channel region is p-type. The charged insulating structure 110b may include a stack of an undoped layer, a doped and charged layer and an undoped layer, for example. An insulating layer or structure is considered uncharged herein if it includes charges per unit area of less than $5\times10^{11}$ cm$^{-2}$, or less than $2\times10^{11}$ cm$^{-2}$ or even less than $1\times10^{11}$ cm$^{-2}$. An insulating layer including a small amount of charges, i.e. an amount smaller than above threshold that is included into an insulating layer due to e.g. contamination with charged ions during processing, is not encompassed by the term charged insulating layer or structure as used herein. As an example, a gate dielectric may be uncharged.

As an example, the fourth dielectric part 110d may include a thermal oxide. When forming the thermal oxide, semiconductor material of the semiconductor body 101 surrounding the upper part of the trench 102 is oxidized leading to a step between the second part 110b and the fourth part 110d (not illustrated in FIG. 1).

A field electrode 112 is arranged in a lower part of the trench 102 and a gate electrode 113 is arranged in an upper part of the trench 102. Highly doped polysilicon is one example for a material used for the gate electrode 113 and/or field electrode 112, but any other conductive material such as, for example, metal silicide, metal or the like can also be used. A portion of the dielectric structure 110 that is interposed between the gate electrode 113 and the body region 105 constitutes a gate dielectric.

In the trench 102, the charged insulating structure 110b includes a first charged insulating part 1101b adjoining both the n$^-$-type drift zone 104 and the p-type body region 105, and a second charged insulating part 1102b adjoining the field electrode 112. Formation of the charged insulating structure 110b allows self-aligned formation of the gate electrode 113, and hence self-aligned definition of a channel end towards the n$^-$-type drift zone 104. The charged insulating structure 110b leads to carrier enhancement in a region 117 of the semiconductor body 101 adjoining the charged insulating structure 110b, thereby counter-acting on-current constriction and increase of Ron. Further, the gate to drain charge Qgd can be reduced by adjusting a first distance d$_1$ from the surface 103 to a location where an interface between the drift zone 104 and the body region 105 adjoins the charged insulating structure 110b larger than a second distance $d_2$ from the surface 103 to a bottom side of the gate electrode 113 at a location where the gate electrode 113 adjoins the fourth part 110d. The distances $d_1$ and $d_2$ refer to a same top level and in case of a curved surface 103, $d_1$ and $d_2$ may refer to an uppermost level of the semiconductor body 101.

The semiconductor device 100 may be a field effect transistor (FET) such as a metal oxide semiconductor FET (MOSFET), for example.

Figure 2:
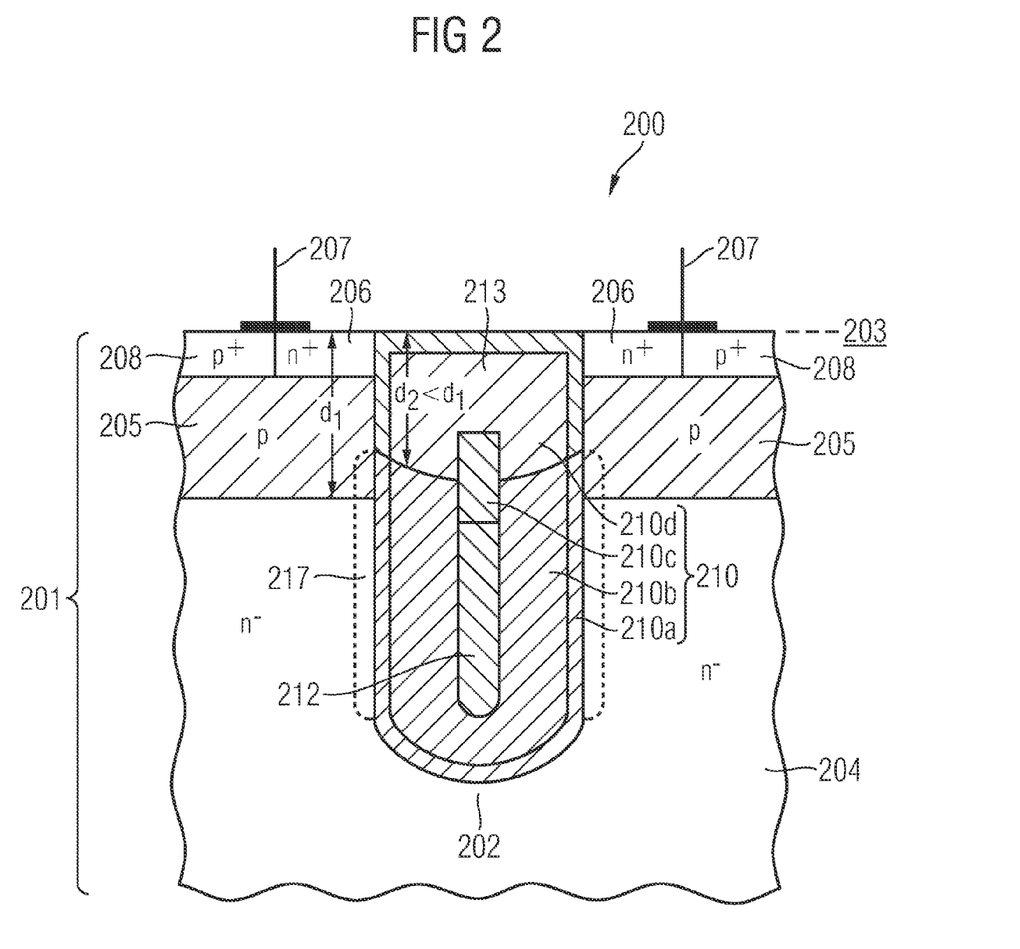

FIG. 2 illustrates a cross-section of a part of a semiconductor device 200 according to another embodiment. Similar to the semiconductor device 100 illustrated in FIG. 1, the semiconductor device 200 includes a semiconductor body 201, a trench 202 extending into the semiconductor body 201 from a surface 203, an $n^-$-type drift zone 204 adjoining a lower part of the trench 202, a p-type body region 205 adjoining an upper part of the trench 202, a $p^+$-type body contact zone 208 and an $n^+$-type source region 206 electrically coupled to a contact 207 on the surface 203, a field electrode 212 and a gate electrode 213.

The semiconductor device 200 further includes a dielectric structure 210. The dielectric structure 210 includes, as a first part of the dielectric structure 210, a charged insulating structure 210a adjoining each one of a sidewall of the trench 202 and a bottom side of the trench 202. The charged insulating structure 210a further adjoins both the $n^-$-type drift zone 204 and the p-type body region 205. The dielectric structure 210 further includes a second dielectric part 210b adjoining the charged insulating structure 210a in a lower part of the trench 203. In the embodiment illustrated in FIG. 2, a third dielectric part 210c is arranged on the field electrode 212. The second and third dielectric parts 210b, 210c may be of different materials, e.g. the second dielectric part 210b may include an oxide and the third dielectric part 210c may include a nitride.

According to another embodiment not illustrated in FIG. 1, the second and third dielectric parts 210b, 210c may be jointly formed as one dielectric part. In this case, the one dielectric part may lack a protruding part such as the third dielectric part 210c illustrated in FIG. 2 that protrudes the second dielectric part 210b.

The dielectric structure 210 further includes a fourth dielectric part 210d in an upper part of the trench 202. The fourth dielectric part 210d may include a thermal oxide. When forming the thermal oxide, semiconductor material of the semiconductor body 201 surrounding the upper part of the trench 202 is oxidized leading to a step between the charged insulating structure 210a and the fourth dielectric part 210d (not illustrated in FIG. 2).

Similar to the semiconductor device 100 illustrated in FIG. 1, formation of the charged insulating structure 210a allows self-aligned formation of the gate electrode 213, and hence self-aligned definition of a channel end towards the $n^-$-type drift zone 204. The charged insulating structure 210a leads to carrier enhancement in a region 217 of the semiconductor body 101 adjoining the charged insulating structure 210a, thereby counter-acting on-current constriction and increase of Ron. Further, the gate to drain charge Qgd can be reduced by adjusting a first distance $d_1$ from the surface 203 to a location where an interface between the drift zone 204 and the body region 205 adjoins the charged insulating structure 210a larger than a second distance $d_2$ from the surface 203 to a bottom side of the gate electrode 213 at a location where the gate electrode 213 adjoins the fourth dielectric part 210d. Since the carrier enhancement in the region 217 extends deeper into the $n^-$-type drift zone 204 than the carrier enhancement in the region 117 of the embodiment illustrated in FIG. 1, the on-state resistance Ron can be further reduced.

Figure 3:
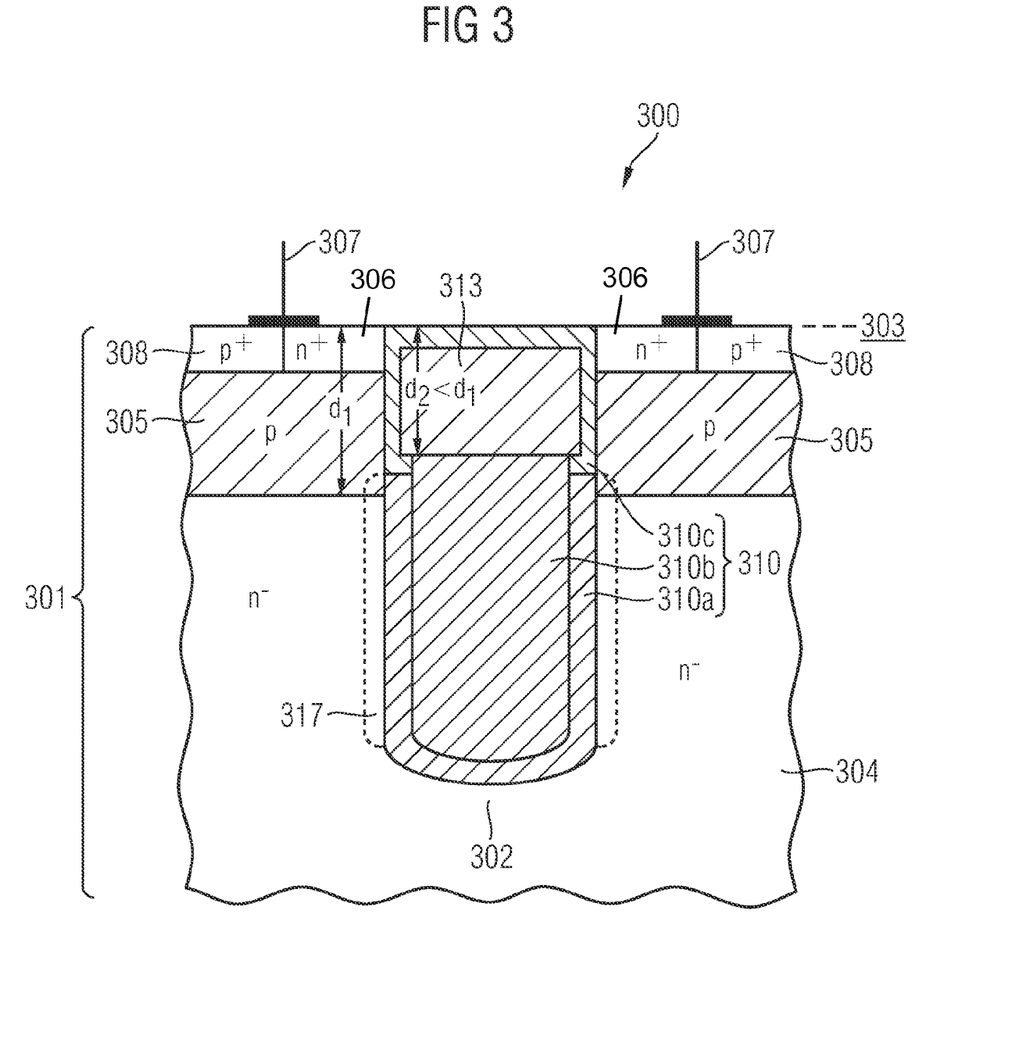

FIG. 3 illustrates a cross-section of a part of a semiconductor device 300 according to another embodiment. Similar to the semiconductor device illustrated in FIG. 2, the semiconductor device 300 includes a semiconductor body 301, a trench 302 extending into the semiconductor body 301 from a surface 303, an $n^-$-type drift zone 304 adjoining a lower part of the trench 302, a p-type body region 305 adjoining an upper part of the trench 302, a $p^+$-type body contact zone 308 and an $n^+$-type source region 306 electrically coupled to a contact 307 on the surface 303, a charged insulating structure 310a as a first part of a dielectric structure 310 adjoining each one of a sidewall of the trench 302 and a bottom side of the trench 302, and a gate electrode 313.

The semiconductor device 300 further includes a second dielectric part 310b of the dielectric structure 310 adjoining the charged insulating structure 310a and a third dielectric part 310c at a sidewall of the trench 302 above the charged insulating structure 310a. The semiconductor device 300 lacks a field electrode in a lower part of the trench 302 according to this embodiment.

Formation of the charged insulating structure 310a allows for similar improvements of Ron and Qgd as described in detail with regard to the embodiment illustrated in FIG. 2.

Figure 4:
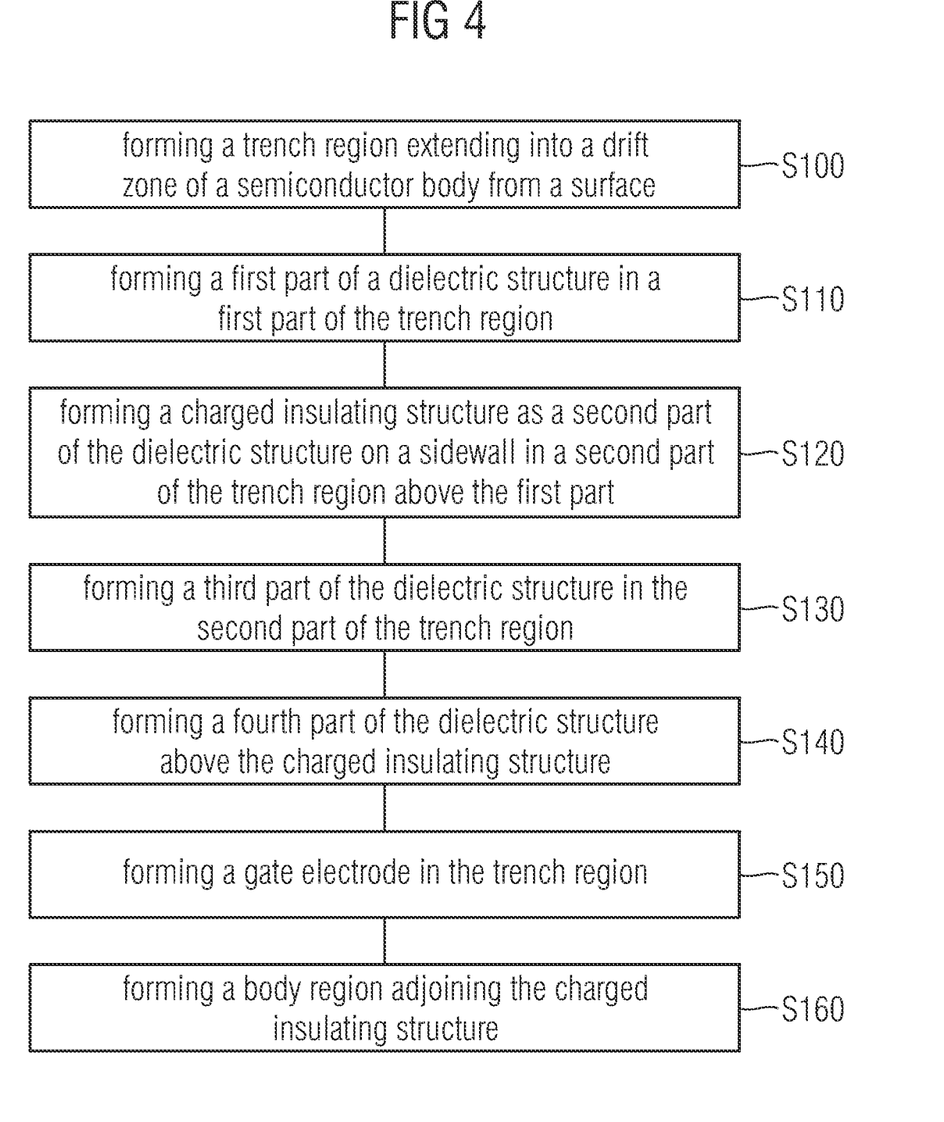
FIG. 4 illustrates a schematic process chart of one embodiment of a method for manufacturing a semiconductor device as illustrated in FIG. 1.

FIG. 4 illustrates a schematic process chart of a method of manufacturing a semiconductor device such as the device 100 illustrated in FIG. 1.

Process feature S100 includes forming a trench region extending into a drift zone of a semiconductor body from a surface.

Process feature S110 includes forming a first part of a dielectric structure in a lower part of the trench region.

Process feature S120 includes forming a charged insulating structure as a second part of the dielectric structure on a sidewall in a second part of the trench region above the first part Process feature S130 includes forming a third part of the dielectric structure in the second part of the trench region Process feature S140 includes forming a fourth part of the dielectric structure above the charged insulating structure.

Process feature S150 includes forming a gate electrode in the trench region.

Process feature S160 includes forming a body region adjoining the charged insulating structure.

FIGS. 5A to 5I illustrate schematic cross-sections of a semiconductor body at different phases during manufacture of a semiconductor device such as illustrated in FIG. 1 according to an embodiment.

Figure 5A:
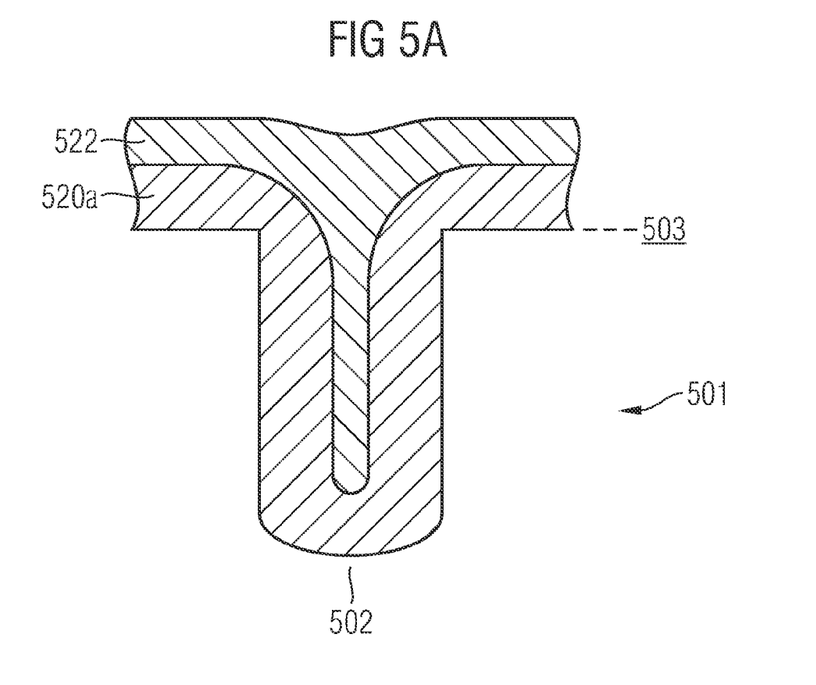
FIGS. 5A to 5H illustrate schematic cross-sections of a semiconductor body at different phases during one embodiment of a method for manufacturing a semiconductor device as illustrated in FIG. 1.

In the cross-section of a semiconductor body 501 illustrated in FIG. 5A, a trench 502 is formed into the semiconductor body 501 from a surface 503. As an example, the trench 502 may be formed by anisotropic etching, e.g. dry etching. The semiconductor body 501 may be a semiconductor wafer, e.g. a silicon wafer, including none, one or a plurality of semiconductor layers, e.g. epitaxial semiconductor layers, thereon.

A first dielectric layer 520a such as an oxide layer is formed on the surface 503, on sidewalls and on a bottom side of the trench 502. According to one embodiment, the first dielectric layer 520a is formed by deposition such as conformal deposition by a method such as low pressure chemical vapor deposition (LPCVD), for example. According to another embodiment, the first dielectric layer 520a is formed by thermal oxidation or a sequence of a thermal oxidation followed by a CVD process. Then, the trench 502 is filled up with a field electrode material 522, e.g. by deposition of a conductive material such as doped polysilicon, silicide, metal, or a stack of any combination of these materials.

Figure 5B:
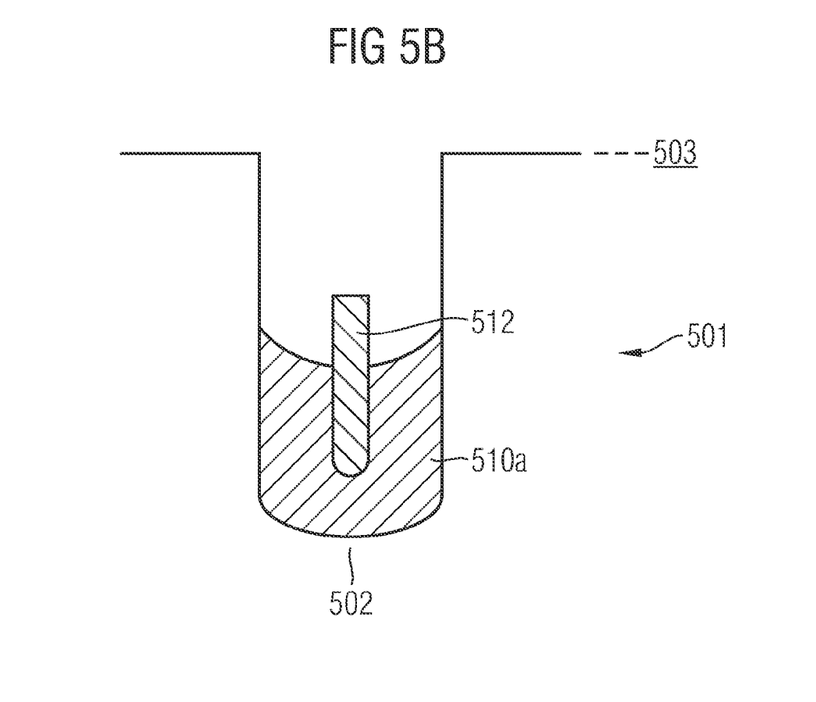

Referring to the cross-section of the semiconductor body 501 illustrated in FIG. 5B, the field electrode material 522 is removed in an upper part of the trench 502. A remaining material of the field electrode material constitutes a field electrode 512. The field electrode material 522 may be removed by selectively etching the field electrode material 522 over a material of the first dielectric layer 520a, for example. Then, the first dielectric layer 520a is removed in an upper part of the trench 502 and even below a top side of the field electrode 512. The first dielectric layer 520a may be removed by etching such as wet etching, for example. A remainder of the first dielectric layer 520a constitutes a first dielectric part 510a of a dielectric structure 510.

Figure 5C:
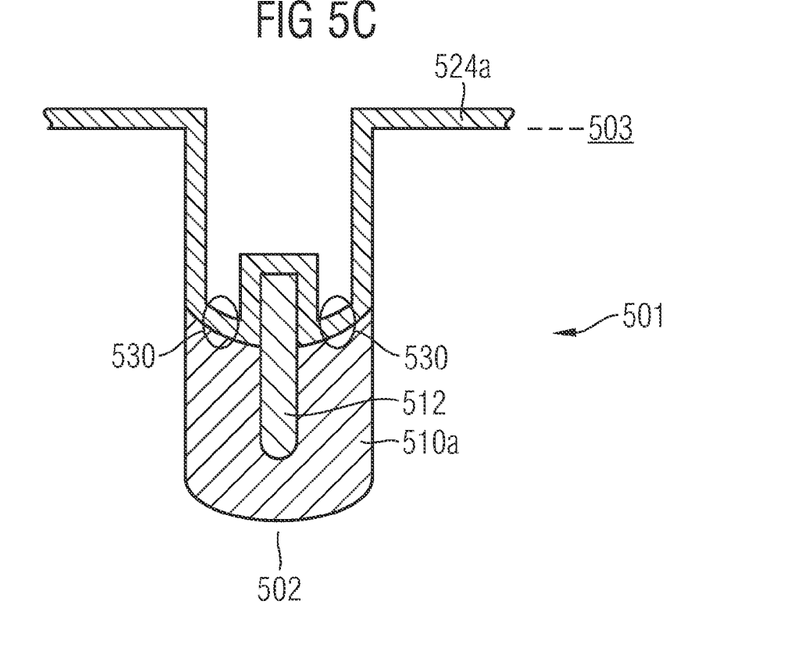
Figure 5D:
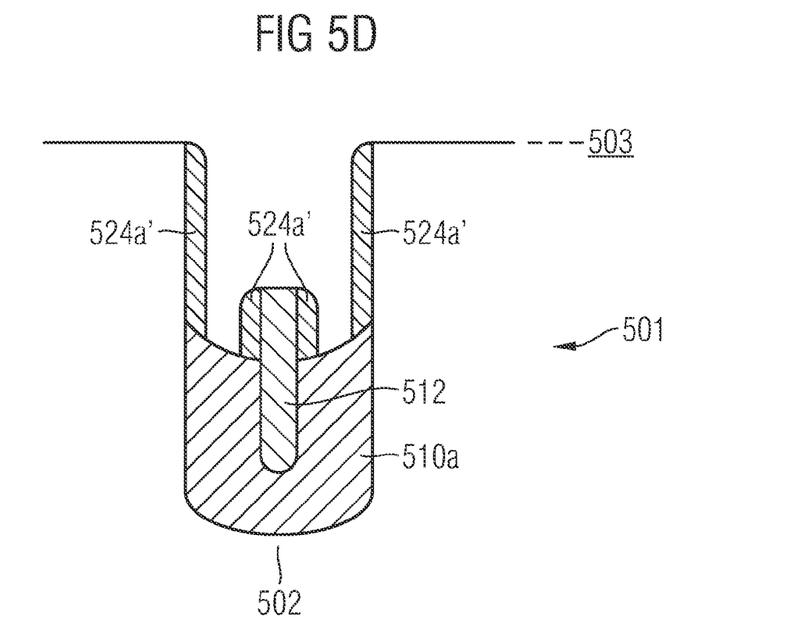

Referring to the cross-section of the semiconductor body 501 illustrated in FIG. 5C, a charged insulating layer 524a is formed on the surface 503 and on an exposed surface in the trench 502. According to one embodiment, the charged dielectric layer 524a may be formed by nitriding an oxide layer, e.g. by thermal annealing in an ambient including $NH_3$. According to another embodiment, formation of the charged insulating layer 524a includes adding of cesium ions to this layer. Adding of cesium ions may be achieved by doping the dielectric with cesium and/or by a cesium precursor layer. The cesium precursor layer may be formed by atomic layer deposition (ALD) or by immersing the semiconductor body 501 into a solution including cesium ions, e.g. a CsCl solution. Referring to the cross-section of the semiconductor body 501 illustrated in FIG. 5D, the charged insulating layer 524a is removed from the surface 503 and uppermost portions of the first dielectric part 510a and the field electrode 512 by an anisotropic etch such as a spacer etch process, for example. A remaining part of the charged insulating layer 524a is denoted by reference symbol 524a'.

Figure 5E:
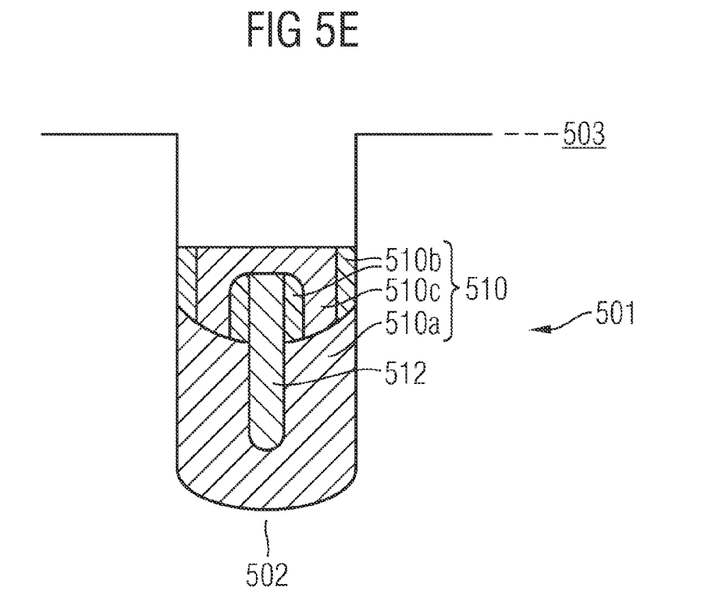

Referring to the cross-section of the semiconductor body 501 illustrated in FIG. 5E, a charged insulating structure 510b constituting a second dielectric part and a third dielectric part 510c of the dielectric structure 510 are formed in the trench 502. The third dielectric part 510c may be formed as a third dielectric layer, e.g. an oxide and/or nitride such as a high density plasma (HDP) oxide and/or tetraethyl orthosilicate (TEOS). Formation of the second dielectric part 510b may include dielectric layer formation, e.g. deposition, and partial removal of the second dielectric layer from the surface 502 and an upper part of the trench 502 by way of an appropriate method such as dry etching. A remaining part of the second dielectric layer in the trench 502 constitutes the second dielectric part 510b of the dielectric structure 510. When partially removing the second dielectric layer from the surface 502 and an upper part of the trench 502, also the charged insulating layer 524a' may be partially removed and remain as the charged insulating structure 510b constituting the second dielectric part of the dielectric structure 510. A top side of the third dielectric part 510c is adjusted above a top side of the field electrode 512.

Figure 5F:
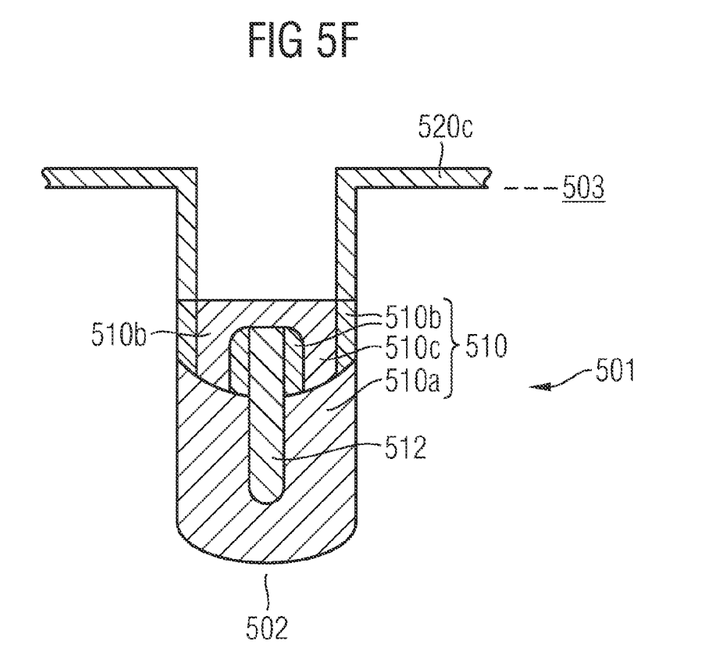

Referring to the cross-section of the semiconductor body 501 illustrated in FIG. 5F, a third dielectric layer 520c, e.g. an oxide or nitride, is formed on exposed sidewalls within the trench 502 and on the surface 503. In the schematic illustration of FIG. 5F the third dielectric layer 520c is formed by thermal oxidation leading to oxidation of a part of the semiconductor body 501 adjoining the sidewalls of the trench 502 and of a part of the semiconductor body 501 adjoining the surface 503. Thermal oxidation of the semiconductor body 501 adjoining the sidewalls of the trench 502 leads to a step between the charged insulating structure 510b and the third dielectric layer 520c (not illustrated in FIG. 5F). According to other embodiments, the third dielectric layer 520c may be formed by layer deposition, for example.

Figure 5G:
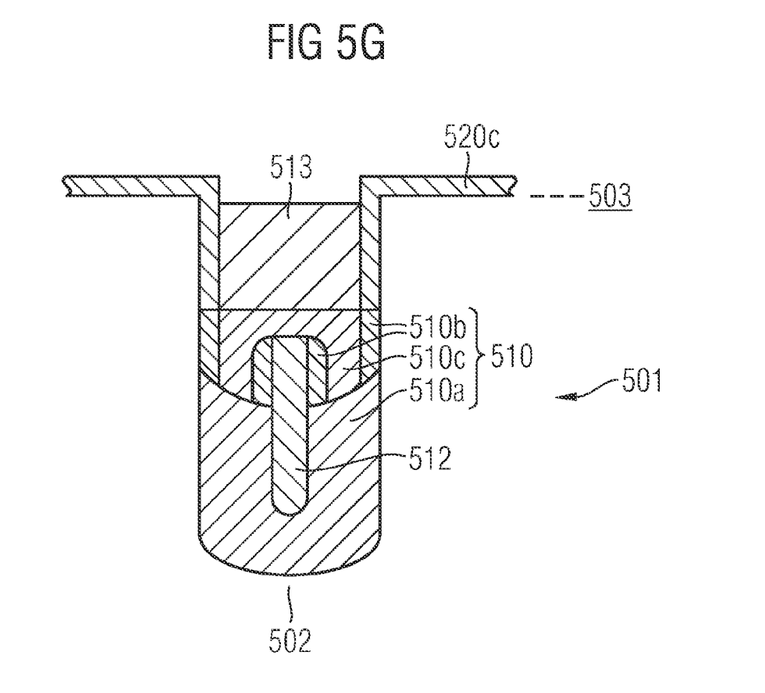

Referring to the cross-section of the semiconductor body 501 illustrated in FIG. 5G, the trench 502 is filled up with a gate electrode material, e.g. by deposition of a conductive material such as doped polysilicon, silicide, metal, or any combination of these materials and a part of the gate electrode material is removed in an upper part of the trench 502. A remaining material of the gate electrode material constitutes a gate electrode 513. The gate electrode material may be removed by selectively etching the gate electrode material over materials of the third dielectric layer 520c, for example. The gate electrode 513 is formed self-aligned with the charged insulating structure 510b.

Figure 5H:
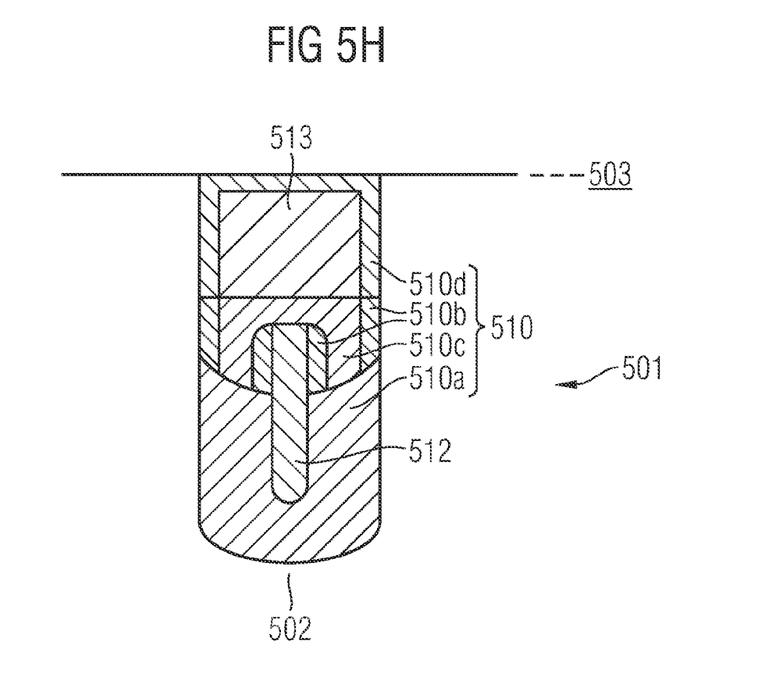

Referring to the cross-section of the semiconductor body 501 illustrated in FIG. 5H, an insulating cap, e.g. an oxide or nitride, is formed on the gate electrode 513 and the third dielectric layer 520c is removed from the surface 503, e.g. by etching or chemical mechanical polishing (CMP). A remaining part of the third dielectric layer 520c and the insulating cap constitute a fourth dielectric part 510d of the dielectric structure 510.

Further to the process carried out in relation to the cross-section illustrated in FIG. 5H, other processes may be carried out, e.g. formation of semiconductor zones such as body, source, drain, contact zones, interconnection layer(s) and interlayer dielectric(s) resulting a device as illustrated in FIG. 1.

Figure 6:
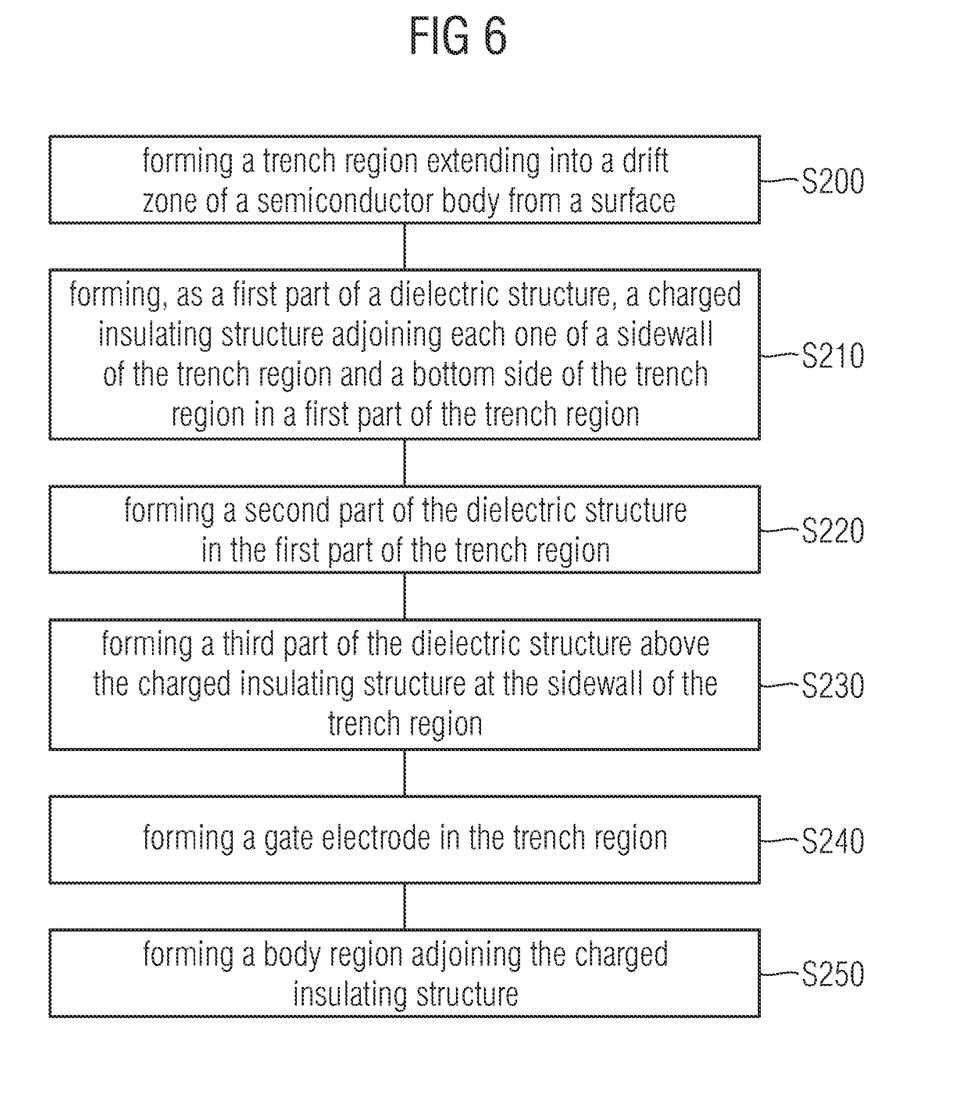
FIG. 6 illustrates a schematic process chart of one embodiment of a method for manufacturing a semiconductor device as illustrated in FIG. 2.

FIG. 6 illustrates a schematic process chart of a method of manufacturing a semiconductor device as illustrated in FIG. 2.

Process feature S200 includes forming a trench region extending into a drift zone of a semiconductor body from a surface.

Process feature S210 includes forming, as a first part of a dielectric structure, a charged insulating structure adjoining each one of a sidewall of the trench region and a bottom side of the trench region in a first part of the trench region.

Process feature S220 includes forming a second part of the dielectric structure in the first part of the trench region.

Process feature S230 includes forming a third part of the dielectric structure above the charged insulating structure at the sidewall of the trench region.

Process feature S240 includes forming a gate electrode in the trench region.

Process feature S250 includes forming a body region adjoining the charged insulating structure.

Figure 7A:
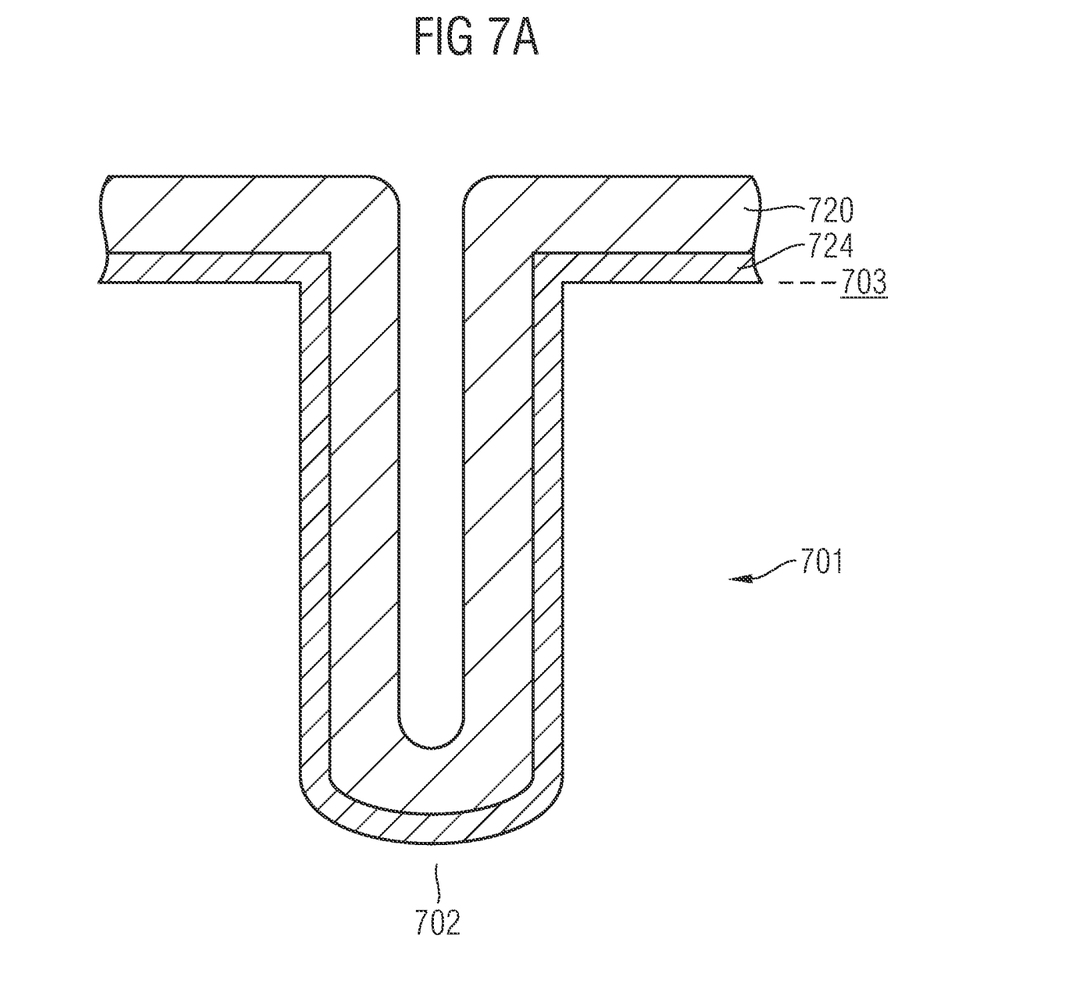
FIG. 7A to 7C illustrate schematic cross-sections of a semiconductor body at different phases during one embodiment of a method for manufacturing a semiconductor device as illustrated in FIG. 2.
Figure 7B:
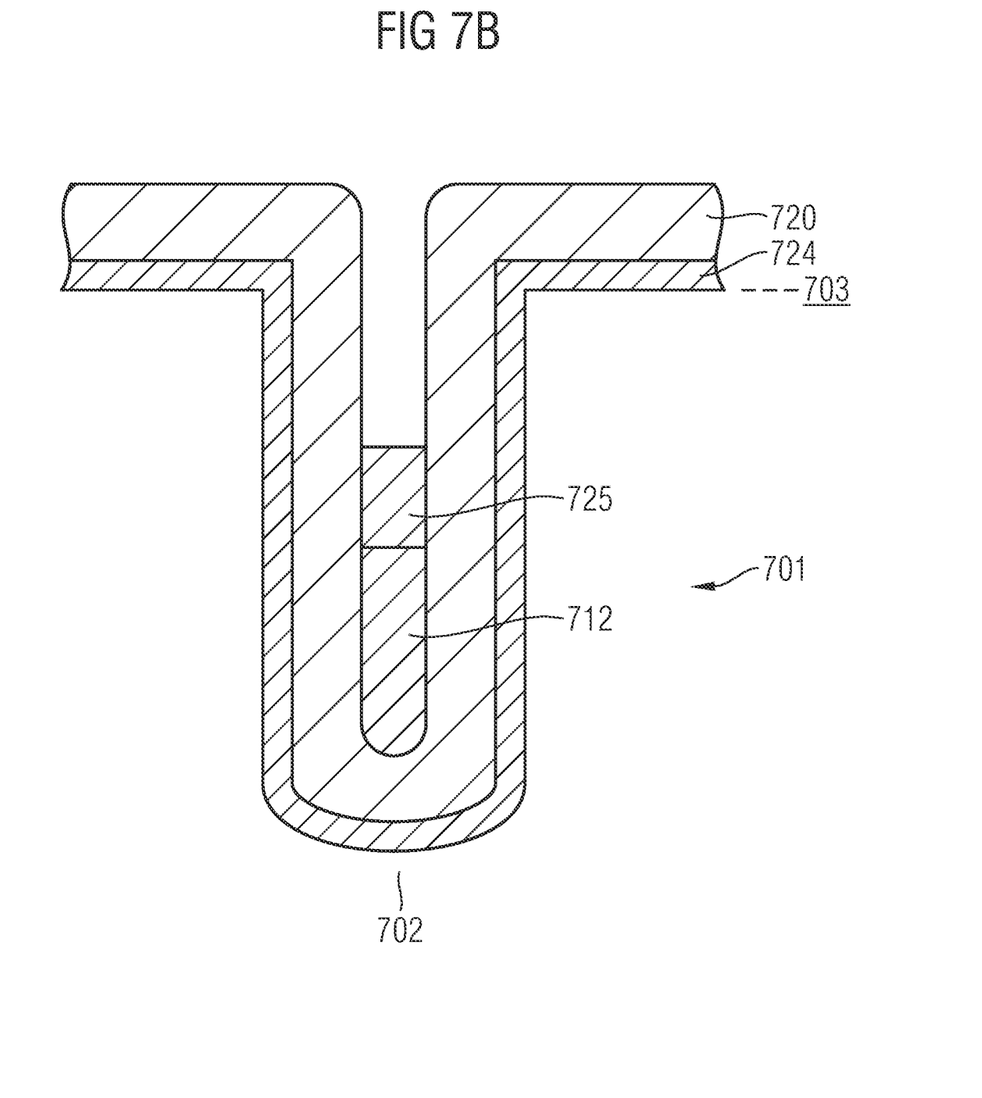
Figure 7C:
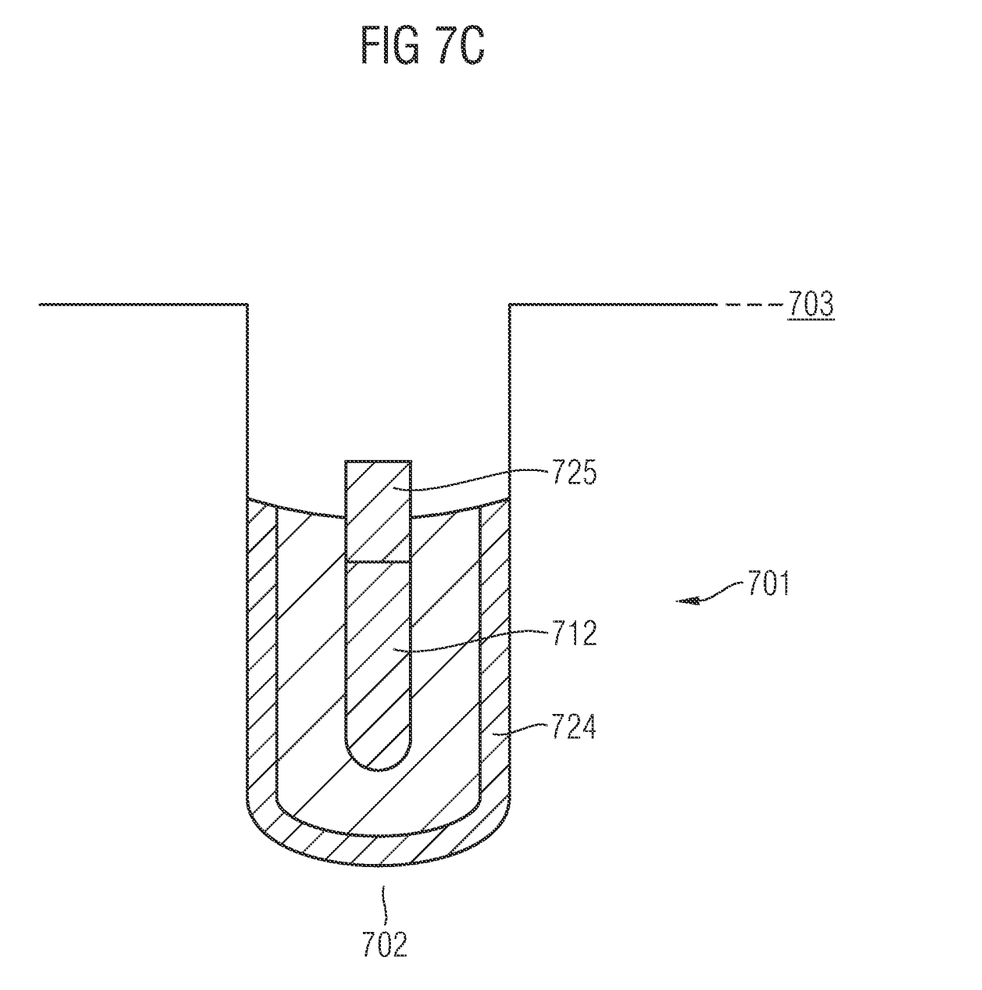

FIGS. 7A to 7C illustrate schematic cross-sections of a semiconductor body at different phases during manufacture of a semiconductor device such as illustrated in FIG. 2 according to an embodiment.

In the cross-section of a semiconductor body 701 illustrated in FIG. 7A, a trench 702 is formed into the semiconductor body 701 from a surface 703. As an example, the trench 702 may be formed by anisotropic etching, e.g. dry etching. The semiconductor body 701 may be a semiconductor wafer, e.g. a silicon wafer, including none, one or a plurality of semiconductor layers, e.g. epitaxial semiconductor layers, thereon.

A charged insulating layer 724 is formed on the surface 703 and on an exposed surface in the trench 702. According to one embodiment, the charged insulating layer 724 may be formed by nitriding an oxide layer, e.g. by thermal annealing in an ambient including $NH_3$. According to another embodiment, formation of the charged insulating layer 724 includes adding of cesium ions to this layer. Adding of cesium ions may be achieved by doping the dielectric with cesium and/or by a cesium precursor layer. The cesium precursor layer may be formed by ALD or by immersing the semiconductor body 701 into a solution including cesium ions, e.g. a CsCl solution. Then, a first dielectric layer 720, e.g. an oxide layer, is formed on the charged insulating layer 724. According to one embodiment, the first dielectric layer 720 is formed by deposition such as conformal deposition by a method such as LPCVD, for example.

Referring to the cross-section of the semiconductor body 701 illustrated in FIG. 7B, the trench 702 is filled up with a field electrode material, e.g. by deposition of a conductive material, e.g. doped polysilicon, silicide, metal, or any combination of these materials. The field electrode material is removed in an upper part of the trench 702. A remaining material of the field electrode material constitutes a field electrode 712. The field electrode material may be removed by selectively etching the field electrode material over a material of the first dielectric layer 720, for example. Then, the trench 702 is filled up with a dielectric material, e.g. by deposition of a nitride. The dielectric material is removed in an upper part of the trench 702. A remaining part 725 of the dielectric material is arranged on the field electrode 712.

Referring to the cross-section of the semiconductor body 701 illustrated in FIG. 7C, the first dielectric layer 720 and the charged insulating layer 724 are removed in an upper part of the trench 702 and below a top side of the remaining part 725 of the dielectric material. Further processes, e.g. formation of a gate dielectric, a gate electrode, a cap dielectric, a body, a source and contacts, as described with reference to FIGS. 5F to 5H follow and lead to a device as illustrated in FIG. 2.

Figure 8:
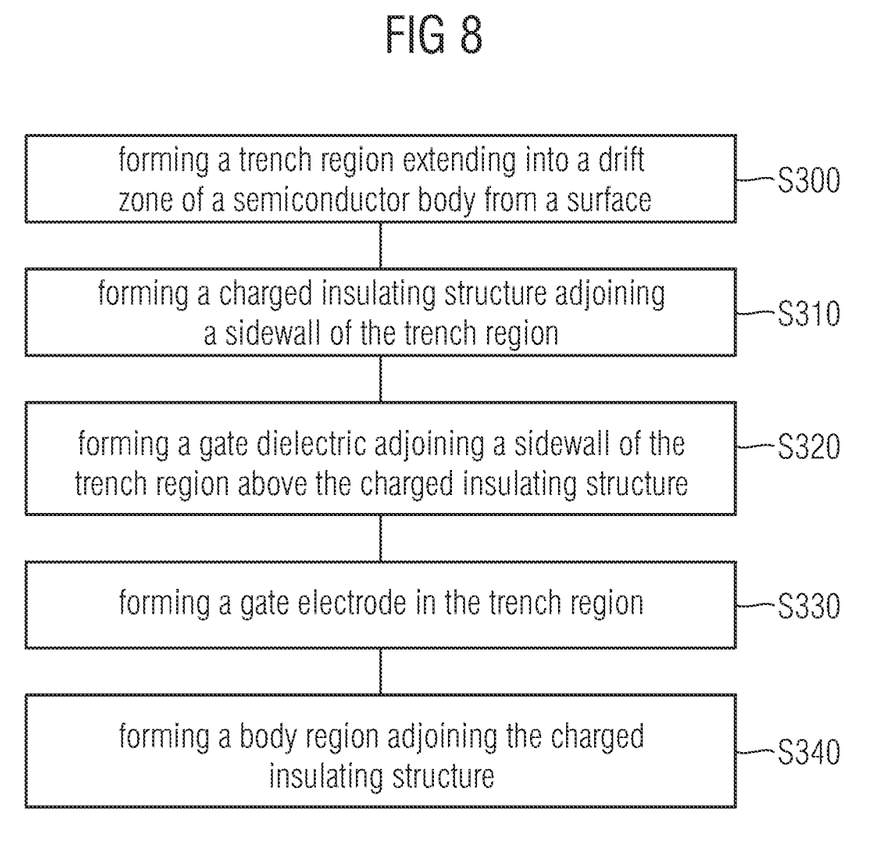
FIG. 8 illustrates a schematic process chart of one embodiment of a method for manufacturing a semiconductor device as illustrated in any of FIGS. 1 to 3.

FIG. 8 illustrates a schematic process chart of a method of manufacturing a semiconductor device as illustrated in any of FIGS. 1 to 3.

Process feature S300 includes forming a trench region extending into a drift zone of a semiconductor body from a surface.

Process feature S310 includes forming a charged insulating structure adjoining a sidewall of the trench region.

Process feature S320 includes forming a gate dielectric adjoining a sidewall of the trench region above the charged insulating structure.

Process feature S330 includes forming a gate electrode in the trench region.

Process feature S340 includes forming a body region adjoining the charged insulating structure.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
  a trench region extending into a drift zone of a semiconductor body from a surface;
  a dielectric structure extending along a lateral side of the trench region, wherein a part of the dielectric structure is a charged insulating structure;
  a gate electrode in the trench region;
  a body region of a conductivity type other than the conductivity type of the drift zone; wherein
  the charged insulating structure adjoins each one of the drift zone, the body region and the dielectric structure and further adjoins or is arranged below a bottom side of a gate dielectric of the dielectric structure; and wherein
  the charged insulating structure is arranged between a gate insulator and a field insulator along a vertical direction perpendicular to the surface, and wherein a thickness of the gate insulator along a lateral direction parallel to the surface is smaller than a thickness of the field insulator along the lateral direction.

2. The semiconductor device of claim 1, wherein the charged insulating structure includes a positive charge per unit area of at least $10^{12}$ cm$^{-2}$ and the conductivity type of the body region is p-type.

3. The semiconductor device of claim 1, wherein the charged insulating structure includes a negative charge per unit area of at least $10^{12}$ cm$^{-2}$ and the conductivity type of the body region is n-type.

4. The semiconductor device of claim 1, wherein the charged insulating structure includes cesium.

5. The semiconductor device of claim 1, wherein a lateral thickness of the charged insulating structure is in a range between 3 nm to 100 nm.

6. The semiconductor device of claim 1, wherein a first distance from the surface to a location where an interface between the drift zone and the body region adjoins the charged insulating structure is larger than a second distance from the surface to a bottom side of the gate electrode at a side of the gate electrode.

7. The semiconductor device of claim 1, wherein a gate insulator of the dielectric structure is arranged between the surface and the charged insulating structure along a vertical direction perpendicular to the surface.

8. The semiconductor device of claim 7, wherein the charged insulating structure adjoins each one of a sidewall of the trench region and a bottom side of the trench region.

9. The semiconductor device of claim 1, further comprising a field electrode arranged between the gate electrode and a bottom side of the trench region.

10. The semiconductor device of claim 9, wherein the charged insulating structure includes a first part adjoining each one of the drift zone, the body region and the dielectric structure and a second part adjoining the field electrode.

11. The semiconductor device of claim 9, wherein an insulator including nitride adjoins a top side of the field electrode.

12. A method for manufacturing a semiconductor device, comprising:
  forming a trench region extending into a drift zone of a semiconductor body from a surface;
  forming a first part of a dielectric structure in a first part of the trench region;
  forming a charged insulating structure as a second part of the dielectric structure on a sidewall in a second part of the trench region above the first part;
  forming a third part of the dielectric structure in the second part of the trench region;
  forming a fourth part of the dielectric structure above the charged insulating structure;
  forming a gate electrode in the trench region; and
  forming a body region adjoining the charged insulating structure.

13. The method of claim 12, wherein forming the charged insulating structure includes introducing cesium.

14. The method of claim 12, wherein forming the charged insulating structure includes introducing charges per unit area of at least $10^{12}$ cm$^{-2}$.

15. The method of claim 12, wherein forming the fourth part of the dielectric structure includes forming a thermal oxide.

16. The method of claim 12, further comprising forming a field electrode in the trench region before forming the gate electrode.

17. The method of claim 12, wherein forming the body region includes forming the body region adjoining the charged insulating structure.

18. A method for manufacturing a semiconductor device, comprising:
    forming a trench region extending into a drift zone of a semiconductor body from a surface;
    forming a charged insulating structure adjoining a sidewall of the trench region;
    forming a gate dielectric adjoining a sidewall of the trench region above the charged insulating structure;
    forming a gate electrode in the trench region; and
    forming a body region adjoining the charged insulating structure; and wherein forming the charged insulating structure includes:
    forming a charged insulating layer adjoining a sidewall of the trench region; and
    removing a part of the charged insulating layer in an upper part of the trench region; and wherein
    the gate electrode is formed self-aligned with the charged insulating structure.

19. A semiconductor device, comprising:
    a trench region extending into a drift zone of a semiconductor body from a surface;
    a dielectric structure extending along a lateral side of the trench region, wherein a part of the dielectric structure is a charged insulating structure;
    a gate electrode in the trench region;
    a body region of a conductivity type other than the conductivity type of the drift zone;
    a field electrode arranged between the gate electrode and a bottom side of the trench region;
    an insulator including nitride adjoining a top side of the field electrode; and wherein
    the charged insulating structure adjoins each one of the drift zone, the body region and the dielectric structure and further adjoins or is arranged below a bottom side of a gate dielectric of the dielectric structure.

* * * * *